United States Patent [19]

Kim

[11] Patent Number: 5,081,066
[45] Date of Patent: Jan. 14, 1992

[54] METHOD FOR FORMING A SILICIDE FILM USED IN A SEMICONDUCTOR CHIP

[75] Inventor: Jae K. Kim, Kyungki, Rep. of Korea

[73] Assignee: Hyundai Electronics Industries Co., Ltd., Rep. of Korea

[21] Appl. No.: 502,844

[22] Filed: Apr. 2, 1990

[30] Foreign Application Priority Data

Apr. 3, 1989 [KR] Rep. of Korea .................. 4350/1989

[51] Int. Cl.$^5$ ............................................. H01L 21/283
[52] U.S. Cl. ..................................... 437/200; 437/193; 437/41; 148/DIG. 19
[58] Field of Search .............. 437/200, 193, 192, 40, 437/41; 148/DIG. 147; 357/67 S, 71 S

[56]  References Cited

U.S. PATENT DOCUMENTS

| 4,458,410 | 7/1984 | Sugaki et al. | 437/200 |
|---|---|---|---|
| 4,625,391 | 12/1986 | Sasaki | 437/27 |
| 4,737,474 | 4/1988 | Price et al. | 437/200 |
| 4,873,205 | 10/1989 | Critchlow et al. | 437/200 |
| 4,966,868 | 10/1990 | Murali et al. | 437/193 |
| 4,992,391 | 2/1991 | Wang | 437/193 |
| 5,001,082 | 3/1991 | Goodwin-Johansson | 437/200 |

FOREIGN PATENT DOCUMENTS

| 62-55928 | 3/1987 | Japan | 437/200 |
|---|---|---|---|
| 2062959 | 5/1981 | United Kingdom | 437/200 |

Primary Examiner—Brian E. Hearn
Assistant Examiner—T. N. Quach
Attorney, Agent, or Firm—Ladas & Parry

[57]  ABSTRACT

A method for forming a silicide film on a conducting layer in a semiconductor device is disclosed. The method comprises providing a semiconductor device having a first conducting layer of a doped silicon. A second conducting layer of an undoped silicon is deposited on the first conducting layer. A metal layer on the second conducting layer and the metal layer is heated to cause it to react with the second conducting layer formed with undoped silicon, thereby forming a uniform silicide film in the second conducting layer deposited on the first conducting layer of the semiconductor device.

7 Claims, 2 Drawing Sheets

METHOD FOR FORMING A SILICIDE FILM USED IN A SEMICONDUCTOR CHIP

BACKGROUND OF THE INVENTION

1. Field of the Invention

The present invention relates to a method for forming a silicide film having a uniform surface, and more particularly to a method for forming the silicide film used in semiconductor such that a conducting layer used in semiconductor, for example a conducting layer for the gate electrode of MOSFET, is formed sequentially with a doped polysilicon (or doped amorphous silicon and an undoped polysilicon (or undoped amorphous silicon). A silicide film is then formed in the undoped polysilicon by heat treatment in a furnace of a metal layer formed on the undoped polysilicon.

2. Information Disclosure Statement

In general, the polysilicon used as a conducting layer and has a sheet resistance of, for example, about 50 ohm/□. As the integrity of the memory device increases, the line width of the conducting layer decreases, thereby increasing the line resistance of the conducting layer. Therefore RC delay time is increased if the line resistance of the conducting layer is increased.

Therefore, if a silicide film is formed on the conducting layer, the resistance value of the silicide film can be reduced to less than 1/10 compared with the resistance value of the polysilicon conducting layer without the silicide film, thereby decreasing the RC delay time and enhancing the current transfer capability of the device.

In general, an embodiment for forming a silicide film used in the semiconductor device in the prior art has been proposed such that an impurity doped polysilicon, such as a conducting layer, is formed on the substrate. A metal layer is then deposited on the polysilicon and a silicide film is then formed by heat treatment of the metal layer deposited on the polysilicon. However, according to the above mentioned prior art process the surface of the resultant silicide film is rough and does not have a uniform thickness. That is, when the silicide film is selectively formed on the gate electrode, source electrode and drain electrode in the case of the MOSFET, if the concentration of which N type impurity (phosphorus or arsenic) contained in the polysilicon and which thermally reacts with the metal layer, is above 10 to the 20th power (Atoms/cubic cm), the speed of reaction therebetween becomes too slow. Therefore in order to form the desired thickness of the silicide film either more thermal processing or more thermal processing time is required. However, if rapid thermal annealing equipment is utilized in order to apply longer thermal processing time the throughput in the process is reduced; and if the higher thermal processing is utilized, the surface of the silicide film becomes too rough. Also, if the concentration of phosphorus and arsenic increases, a problem occurs in that the interface between the resultant silicide film and the surface of the silicon layer becomes significantly rough.

Accordingly in order to solve the problem mentioned above, attempts had been made to form a uniform surface of the silicide film by lowering the impurity concentration of the phosphorus or the arsenic to form the N+ region at source region and drain region of the MOSFET, and after the silicide film is preformed, a uniform surface thereof is formed by forming the N+ region by ion implantation at the source region and drain region of the MOSFET. However, the concentration of the polysilicon which is used as the gate electrode of the MOSFET cannot be lowered because the work function of the polysilicon should be stably maintained, and the implantation of the impurity is impossible if the silicide film has been formed over the polysilicon layer.

Accordingly, it is an object of the present invention to solve the problems presented in the prior art and to provide a method for forming a uniform silicide film on the conducting layer used in the semiconductor device.

SUMMARY OF THE INVENTION

This invention is defined by the appended claims with a specific embodiment illustrated in the attached drawings. For the purpose of summarizing the invention, the invention may be incorporated into a method for forming a silicide film on a conducting layer in a semiconductor device. The method comprises providing a semiconductor device having a first conducting layer of a doped silicon such as either doped polysilicon or doped amorphous silicon doped with an impurity selected from the group consisting of phosphorus and arsenic. A second conducting layer of an undoped silicon such as either undoped polysilicon or undoped amorphous silicon is deposited on the first conducting layer. A metal layer such as titanium is then deposited on the second conducting layer. Preferably, the metal is titanium. The metal layer is then heated to cause it to react with the second conducting layer of undoped silicon, thereby forming a uniform silicide film in the second conducting layer deposited on the first conducting layer of the semiconductor device.

In one embodiment of the invention the doped silicon of the first conducting layer is a doped polysilicon doped with an impurity selected from the group consisting of phosphorus and arsenic; and the undoped silicon of the second conducting layer is an undoped polysilicon.

In another embodiment of the invention the doped silicon of the first conducting layer is doped amorphous silicon doped with an impurity selected from the group consisting of phosphorus and arsenic; and the undoped silicon of the second conducting layer is an undoped amorphous silicon.

The present invention further includes a method for forming a silicide film on a conducting layer for a gate electrode of a MOSFET. This method comprises providing a silicon substrate and forming an oxide layer for segment separation in a portion of the silicon substrate. A gate oxide film, a first conducting layer of a doped silicon and a second conducting layer of an undoped silicon on the silicon substrate are sequentially formed. A gate electrode is formed by removing a portion of the second conducting layer, the first conducting layer and the gate oxide film by mask patterning process for gate electrode. An oxide film is deposited over the entire surface of the structure. Oxide spacers are formed by anisotropic etching of the oxide film at each side of the gate electrode. A metal layer such as titanium is then deposited on the entire surface of the structure. Preferably, the metal is titanium. The metal layer is heated thereby reacting the metal of the metal layer with the second conducting layer formed with the undoped silicon, whereby a uniform silicide film is formed in the second conducting layer deposited on the first conducting layer for gate electrode of the MOSFET.

In one embodiment of the present invention the doped silicon of the first conducting layer is a doped polysilicon doped with an impurity selected from the group consisting of phosphorus and arsenic, and the undoped silicon of the second conducting layer is an undoped polysilicon. In another embodiment of the present invention the doped silicon of the first conducting layer is an amorphous silicon doped with an impurity selected from the group consisting of phosphorus and arsenic, and the undoped silicon of the second conducting layer is an undoped amorphous silicon.

BRIEF DESCRIPTION OF THE DRAWINGS

For fuller understanding of the nature and objects of the invention, reference should be made to the following detailed description taken in conjunction with the accompanying drawings in which.

The novel feature of the present invention may be understood form the accompanying description when taken in conjunction with the accompanying drawings.

While the present invention has been described with respect to the preferred embodiment of the process for forming a uniform silicide film formed on the gate electrode of MOSFET, as appreciated by one skilled in the art, it should noted that the same process can be applied to the interconnection line instead of the gate electrode of MOSFET.

DETAILED DESCRIPTION OF THE INVENTION

Figure 1:
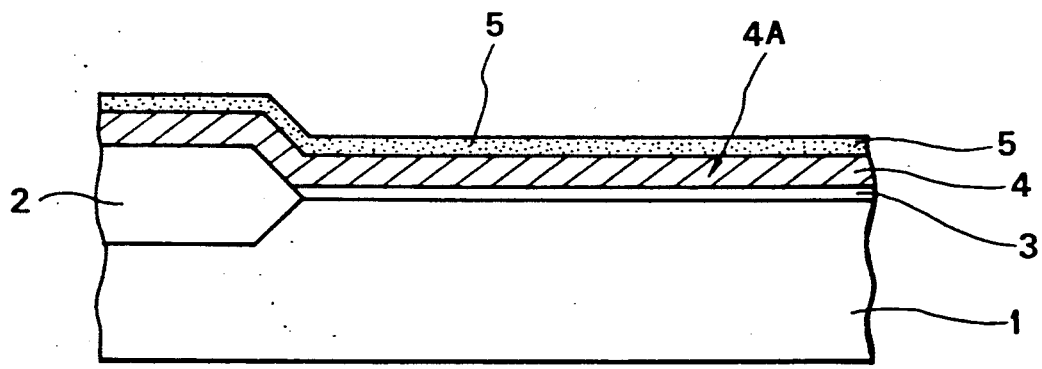
FIG. 1 is a schematic cross sectional view of the semiconductor device in which a gate oxide film, the first conducting layer and the second conducting layer are stacked on the silicon substrate.

FIG. 1 illustrates a cross section of the silicon substrate 1 on which an oxide layer 2 for segment separation is formed on a portion of the silicon substrate 1, a gate oxide film 3 is then formed on the exposed silicon substrate 1, and a doped polysilicon 4 (or a doped amorphous silicon) for gate electrode of the first conducting layer and undoped polysilicon 5 (or an undoped amorphous silicon layer) of the second conducting layer are sequentially deposited on the entire surface of the gate oxide film 3 and the oxide layer 2 for segment separation. Two methods for forming the first conducting material with doped polysilicon 4 before depositing the second conducting material with undoped polysilicon 5 have been proposed as follows:

1) The first is to form the first conducting layer with doped polysilicon 4 by doping an impurity into undoped polysilicon 4A after the undoped polysilicon 4A has been deposited.

2) The second is an In-Situ method to form the first conducting layer with doped polysilicon 4 by doping the impurity into the undoped polysilicon 4A at the same time the undoped polysilicon 4A is formed on the gate oxide layer 3.

While the invention has been described with respect to the preferred embodiment using a doped and undoped polysilicon as the first and second conducting layer, respectively, it should be noted that doped and undoped amorphous silicon layer can be used as the first and second conducting layer, respectively.

Figure 2:
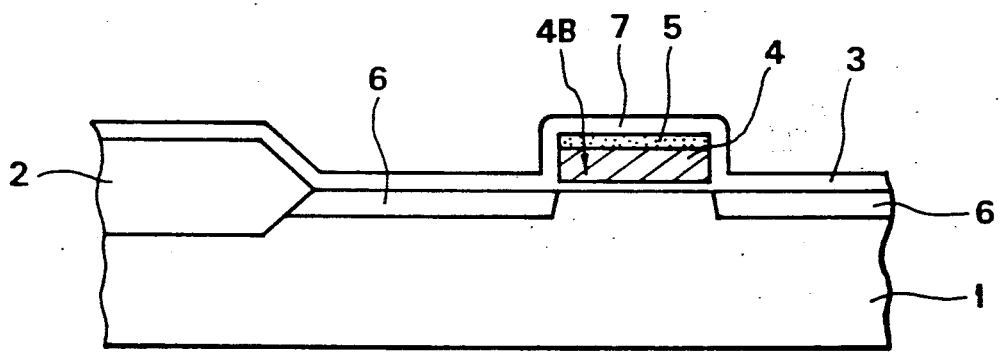
FIG. 2 is a schematic cross sectional view of the semiconductor device in which a gate electrode is formed and an oxide film is then formed on the entire surface of the structure in connection with FIG. 1.

FIG. 2 illustrates a gate electrode 4B formed by removing a portion of the undoped polysilicon 5, doped polysilicon 4 and gate oxide film 2 by the mask patterning process. Furthermore, an oxide film 7 is deposited on the entire surface of the structure after forming LDD (Lightly Doped Drain) region 6 by ion implanting the silicon substrate 1 at each side of the gate electrode 4B.

Figure 3:
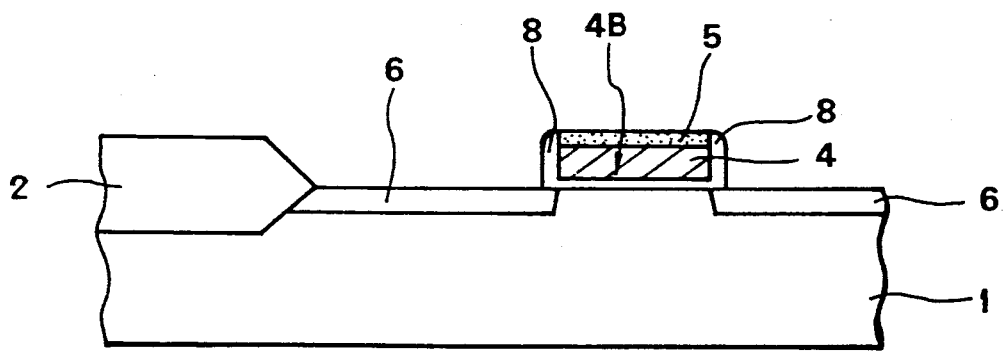
FIG. 3 is a schematic cross sectional view of the semiconductor device in which an oxide spacer is formed on each side of the gate electrode.

FIG. 3 illustrates an oxide spacer 8 formed at each side of the gate electrode 4B. Oxide spacers 8 are formed by an isotropic etching of the oxide film 7.

Figure 4:
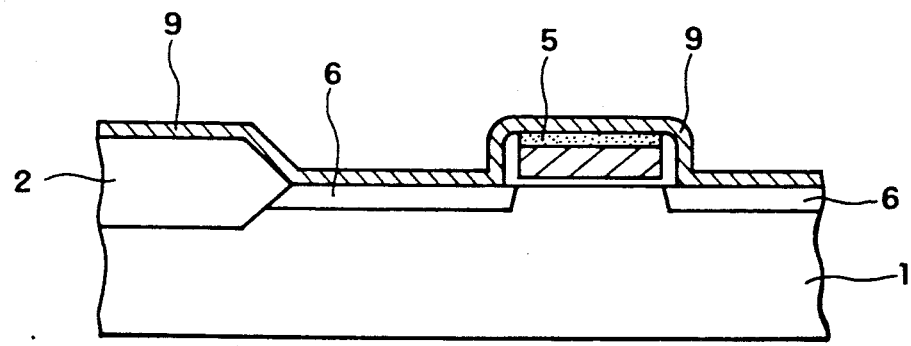
FIG. 4 is a schematic cross sectional view of the semiconductor device in which a metal layer is formed on the entire surface of the structure in connection with FIG. 3.

FIG. 4 illustrates, in cross section, a metal layer 9, such as for example titanium, deposited, as thick as 300-1500 Å, on the oxide layer 2 for segment separation, LDD region 6, oxide spacer 8 and undoped polysilicon 5.

Figure 5:
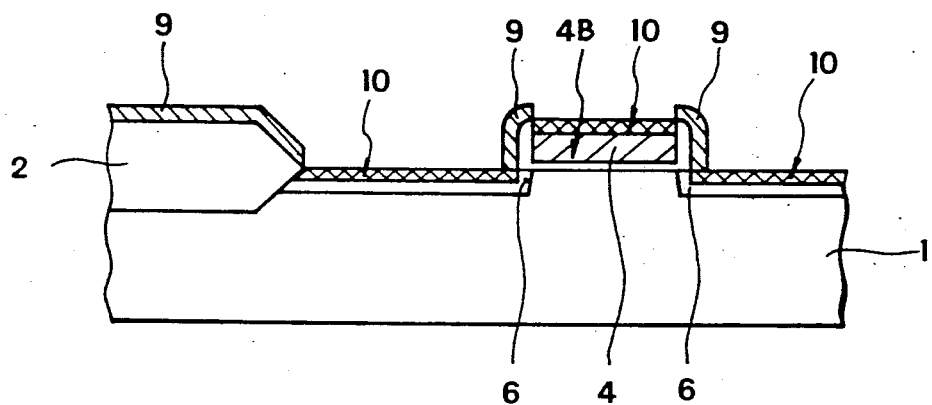
FIG. 5 is a schematic cross sectional view of the semiconductor device in which a silicide film is formed on the gate electrode by the heat treatment of the metal layer according to the present invention.

FIG. 5 illustrates, in cross section, a metal silicide film 10 formed at the undoped polysilicon 5 on the gate electrode 4B and at the LDD region 6 by thermal processing the metal layer 9 at a temperature of 570-650 degrees Celsius in the furnace as known by one skilled in the art.

Figure 6:
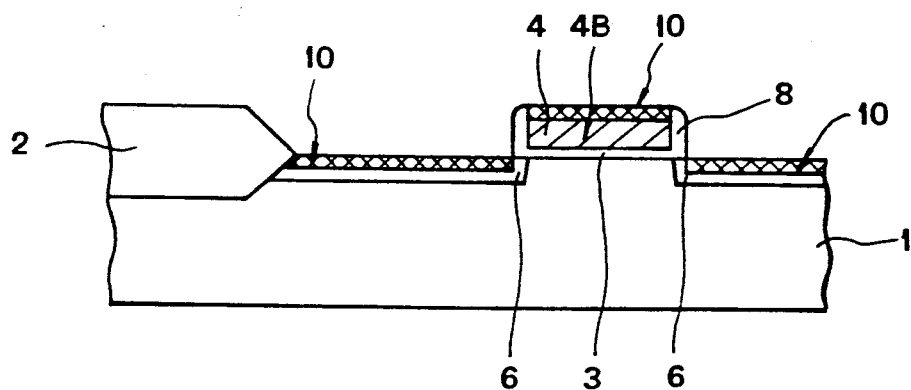
FIG. 6 is a schematic cross sectional view of the semiconductor device in which the metal layer is removed according to the present invention.

FIG. 6 illustrates a sectional view of metal layer 9 formed on the oxide layer 2 for segment separation and on the oxide spacer 8 having been selectively removed. If the metal silicide film 10 is not completely formed at the undoped polysilicon 5, due to inaccurate controlling of the thickness of the undoped polysilicon 5 during the thermal processing, impurity from the doped polysilicon 4 diffuses into the undoped polysilicon 5 during a subsequent thermal process, such as the developing process of an oxide film, which is not shown in drawing, which will be performed in connection with the process of FIG. 6, thereby causing the incompletely undoped polysilicon 5 to be converted to the doped polysilicon.

As described above, according to the present invention, a uniform silicide film on the first conducting layer can be obtained by thermal processing the metal layer after the metal layer has been formed on undoped polysilicon (or the undoped amorphous silicon) as the second conducting layer which was deposited on the doped polysilicon (or the doped amorphous silicon) as the first conducting layer.

The forgoing description of the preferred embodiments has been presented for the purpose of illustration and description. It is not intended to limit the scope of this invention. Many modifications and variation are possible in the light of above teaching. It is intended that the scope of the invention be defined by the claims.

What is claimed is:

1. A method for forming a silicide film on a conducting layer for a gate electrode of a MOSFET, the method comprising:

providing a silicon substrate;

forming an oxide layer for segment separation in a portion of the substrate;

sequentially forming a gate oxide film, a first conducting layer of a doped silicon and a second conducting layer of an undoped silicon on the silicon substrate;

forming a gate electrode by removing a portion of the second conducting layer, the first conducting layer and the gate oxide film by mask patterning process for gate electrode;

depositing an oxide film over the entire surface of the structure;

forming an oxide spacer by anisotropic etching of the oxide film at each side of the gate electrode;

depositing a metal layer on the entire surface of the structure; and heating the metal layer thereby reacting the metal of the metal layer with the second conducting layer of undoped silicon, whereby a uniform silicide film is formed in the second conducting layer deposited on the first conducting layer for gate electrode of the MOSFET.

2. The method of claim 1 wherein the doped silicon of the first conducting layer is a doped polysilicon doped with an impurity selected from the group consisting of phosphorus and arsenic, and the undoped silicon of the second conducting layer is an undoped polysilicon.

3. The method of claim 1 wherein the doped silicon of the first conducting layer is an amorphous silicon doped with an impurity selected from the group consisting of phosphorus and arsenic, and the undoped silicon of the second conducting layer is an undoped amorphous silicon.

4. The method of claim 1 wherein the metal layer is titanium.

5. A method for forming a silicide film on a conducting layer for a gate electrode of a MOSFET, the method comprising:

providing a silicon substrate;

forming an oxide layer for segment separation in a portion of the substrate;

sequentially forming on the silicon substrate: a gate oxide film, a first conducting layer of a doped silicon, wherein the doped silicon is selected from the group consisting of: doped polysilicon and doped amorphous silicon, and a second conducting layer of an undoped silicon, wherein the undoped silicon is selected from the group consisting of: undoped polysilicon and undoped amorphous silicon;

forming a gate electrode by removing a portion of the second conducting layer, the first conducting layer and the gate oxide film by mask patterning process for gate electrode;

depositing an oxide film over the entire surface of the structure;

forming an oxide spacer by anisotropic etching of the oxide film at each side of the gate electrode;

depositing a metal layer on the entire surface of the structure wherein the metal layer is titanium; and heating the metal layer thereby reacting the metal of the metal layer with the second conducting layer formed with the undoped silicon, whereby a uniform silicide film is formed in the second conducting layer deposited on the first conducting layer for gate electrode of the MOSFET.

6. The method of claim 5 wherein the doped silicon of the first conducting layer is doped polysilicon which is doped with an impurity selected from the group consisting of: phosphorus and arsenic; and the undoped silicon of the second conducting layer is an undoped polysilicon.

7. The method of claim 5 wherein the doped silicon of the first conducting layer is doped amorphous silicon which is doped with an impurity selected from the group consisting of: phosphorus and arsenic and the undoped silicon of the second conducting layer is an undoped amorphous silicon.

* * * * *